US012694181B2

(12) United States Patent   (10) Patent No.:   US 12,694,181 B2
Choi et al.   (45) Date of Patent:   Jul. 28, 2026

(54) HIGH-LEVEL-SYNTHESIS FOR RISC-V SYSTEM-ON-CHIP GENERATION FOR FIELD PROGRAMMABLE GATE ARRAYS

(71) Applicant: Microsemi SoC Corp., Chandler, AZ (US)

(72) Inventors: Jongsok Choi, Toronto (CA); David Ma, North York (CA); Ruolong Lian, North York (CA)

(73) Assignee: Microsemi SOC Corp., Chandler, AZ (US)

( * ) Notice: Subject to any disclaimer, the term of this patent is extended or adjusted under 35 U.S.C. 154(b) by 672 days.

(21) Appl. No.: 18/208,381

(22) Filed: Jun. 12, 2023

(65) Prior Publication Data

US 2023/0409793 A1    Dec. 21, 2023

Related U.S. Application Data

(60) Provisional application No. 63/352,840, filed on Jun. 16, 2022.

(51) Int. Cl.
*G06F 30/34*   (2020.01)
*G06F 30/343*   (2020.01)

(52) U.S. Cl.
CPC .................................. *G06F 30/343* (2020.01)

(58) Field of Classification Search
CPC .............................. G06F 30/343; G06F 30/34
See application file for complete search history.

(56) References Cited

U.S. PATENT DOCUMENTS

2020/0004702 A1* 1/2020 Schardt ............... G06F 13/4068
2023/0252209 A1* 8/2023 Zhu ........................ G06F 30/337
716/106

OTHER PUBLICATIONS

Huang, Qijing et al., "Centrifuge: Evaluating Full-System HLS-Generated Heterogenous-Accelerator SoCs Using FPGA-Acceleration, IEEE/ACM International Conference on Computer-Aided Design," 8 pages, Nov. 4, 2019.
Mantovani, Paolo et al., "Agile SoC Development with Open ESP," arxiv.org, Cornell University, XP081753779, 9 pages, Sep. 2, 2020.
Bellocchi, Gianluca et al., "A RISC-V-Based FPGA Overlay to Simplify Embedded Accelerator Deployment," 24th IEEE Euromicro Conference on Digital System Design, pp. 9-17, Sep. 1, 2021.

(Continued)

*Primary Examiner* — Nghia M Doan

(74) *Attorney, Agent, or Firm* — SLAYDEN GRUBERT BEARD PLLC

(57)   ABSTRACT

An article of manufacture includes a medium with instructions that when read and executed by a processor, cause the processor to identify a code stream to be executed by a system-on-a-chip (SoC). The SoC is to include an open standard processor and hardware accelerators implemented in reprogrammable hardware. The processor is to, from the code stream, identify a first portion of the code stream to be executed as software by the open standard processor and a second portion to be executed in the accelerators, compile the first portion into a binary for execution by the open standard processor, and generate a hardware description for the second portion to be implemented by the hardware accelerators. The hardware description and the binary are to exchange data during execution of the code stream.

20 Claims, 9 Drawing Sheets

100

Processor 102 — Instructor 104

Binary (From 108)
106 Code Stream
108 First Portion, Executed as Software
120
122
HW Description (From 110)
110 Second Portion, to be Executed in Accelerator 112 SOC
114 O-S ISA Processor
120
116 Reprogrammable HW
118 Accelerator(s)
122

112
Exchange Information
during Execution of Code Stream

(56) References Cited

OTHER PUBLICATIONS

Xiao, Yuanlong et al., "PLD: Fast FPGA Compilation to Make Reconfigurable Acceleration Compatible with Modern Incremental Refinement Software Development," Proceedings of the 14th IEEE/ACM Conference on Utility and Cloud Computing Companion, pp. 933-945, Feb. 28, 2022.
International Search Repot and Written Opinion, Application No. PCT/US2023/025511, 17 pages, Oct. 10, 2023.

* cited by examiner

100

102 Processor

104 Instructor

106 Code Stream

108 First Portion, Executed as Software

110 Second Portion, to be Executed in Accelerator

Binary (From 108)

120

122

HW Description (From 110)

112 SOC

114 O-S ISA Processor

120

116 Reprogrammable HW

118 Accelerator(s)

122

112 Exchange Information during Execution of Code Stream

Figure 9:
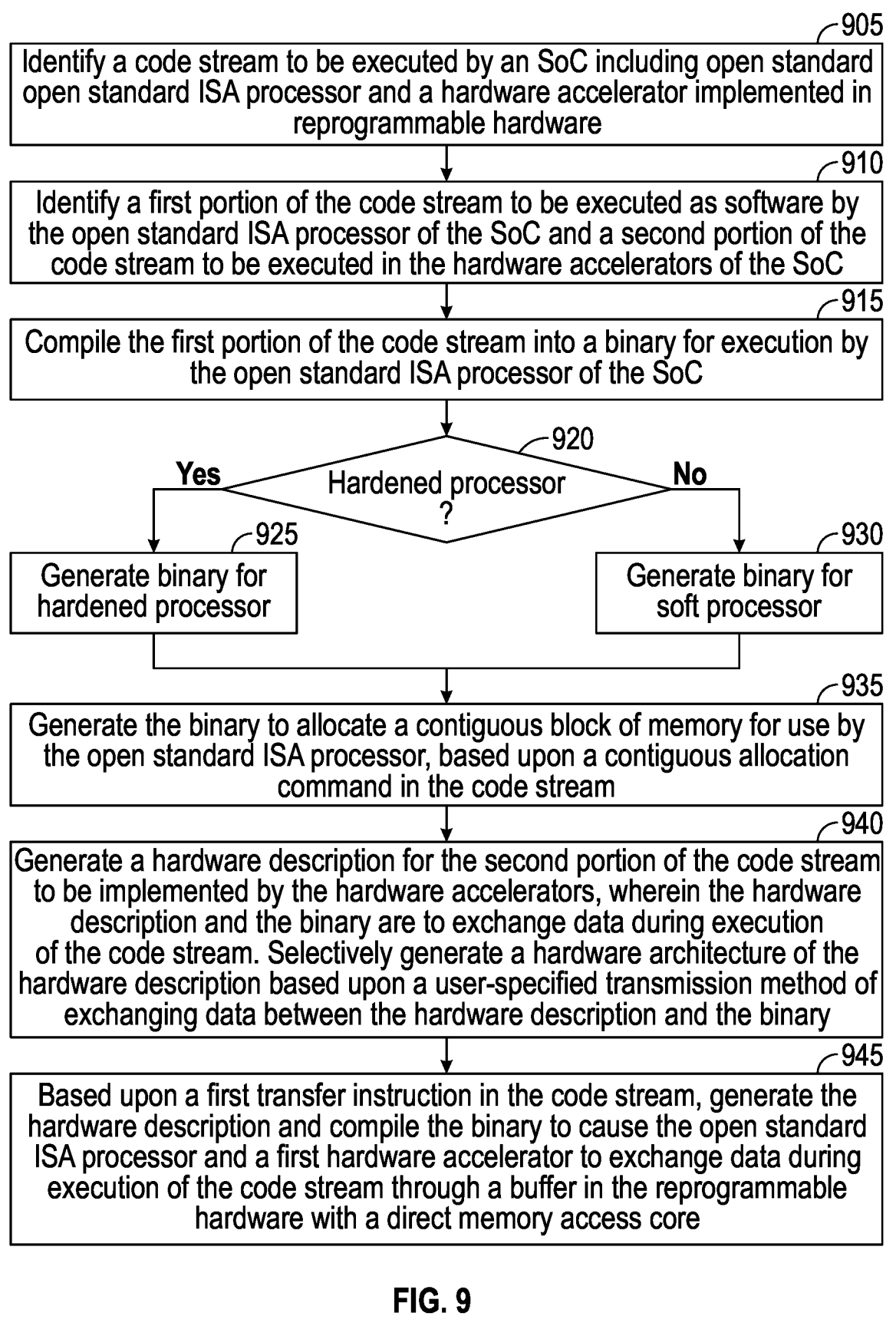

905

Identify a code stream to be executed by an SoC including open standard open standard ISA processor and a hardware accelerator implemented in reprogrammable hardware

910

Identify a first portion of the code stream to be executed as software by the open standard ISA processor of the SoC and a second portion of the code stream to be executed in the hardware accelerators of the SoC

915

Compile the first portion of the code stream into a binary for execution by the open standard ISA processor of the SoC

920

Yes          Hardened processor ?          No

925

Generate binary for hardened processor

930

Generate binary for soft processor

935

Generate the binary to allocate a contiguous block of memory for use by the open standard ISA processor, based upon a contiguous allocation command in the code stream

940

Generate a hardware description for the second portion of the code stream to be implemented by the hardware accelerators, wherein the hardware description and the binary are to exchange data during execution of the code stream. Selectively generate a hardware architecture of the hardware description based upon a user-specified transmission method of exchanging data between the hardware description and the binary

945

Based upon a first transfer instruction in the code stream, generate the hardware description and compile the binary to cause the open standard ISA processor and a first hardware accelerator to exchange data during execution of the code stream through a buffer in the reprogrammable hardware with a direct memory access core

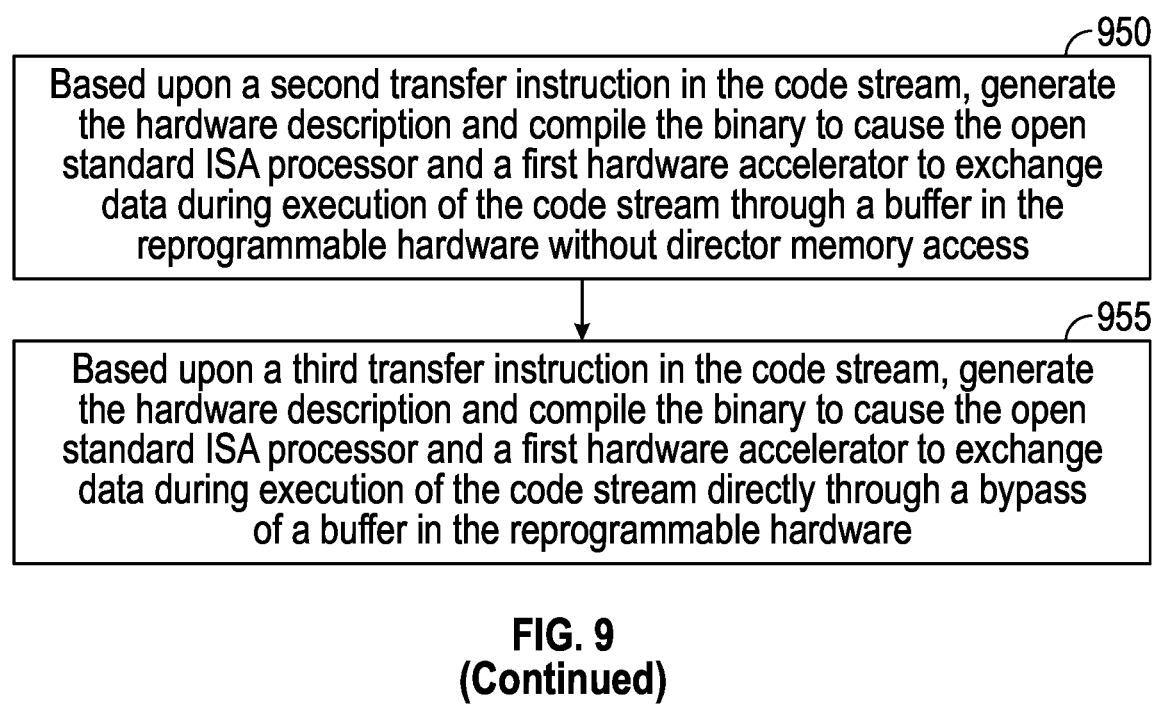

Based upon a second transfer instruction in the code stream, generate the hardware description and compile the binary to cause the open standard ISA processor and a first hardware accelerator to exchange data during execution of the code stream through a buffer in the reprogrammable hardware without director memory access

⌐955

Based upon a third transfer instruction in the code stream, generate the hardware description and compile the binary to cause the open standard ISA processor and a first hardware accelerator to exchange data during execution of the code stream directly through a bypass of a buffer in the reprogrammable hardware

FIG. 9
(Continued)

HIGH-LEVEL-SYNTHESIS FOR RISC-V SYSTEM-ON-CHIP GENERATION FOR FIELD PROGRAMMABLE GATE ARRAYS

PRIORITY

The present application claims priority to U.S. Provisional Patent Application No. 63/352,840 filed Jun. 16, 2022, the contents of which are hereby incorporated in their entirety.

FIELD OF THE INVENTION

The present disclosure relates to reconfigurable micro-processor and microcontroller architecture and, more particularly, to high-level-synthesis (HLS) for RISC-V system-on-chip (SoC) generation for field programmable gate arrays (FPGA).

BACKGROUND

FPGAs may include SoC devices, wherein a processor exists on the same die as the FPGA fabric. SoC FPGAs may pose challenges that have been discovered by inventors of examples of the present disclosure. Having a processor enables software engineers to use the FPGA, but software engineers may be limited to using the processor and not the FPGA fabric, lacking hardware expertise and knowledge of hardware description languages (HDL). HLS may allow a software program to be compiled into a hardware circuit which is in turn described in an HDL. However, integrating a hardware core (such as an accelerator) into a processor system also uses hardware knowledge, making SoC design infeasible for many software engineers.

Moreover, implementing a high-performance SoC design may rely upon careful consideration and implementation of data transfers between processor and hardware logic. Depending on the amount of data transfer, different transfer methods can be beneficial, and it can be difficult for a user to know which data transfer method to use. For large data transfers (i.e., over 16 KBs), DMA (direct memory access) can be beneficial. However, this may have a predicate step to configure DMA engine that can burst large amounts of data from off-chip double data rate (DDR) memory. This might not be possible for software engineers.

SoC designs may also pose new challenges for hardware engineers, as interfacing and integrating an SoC design can be time-consuming and error-prone. An SoC design has software and hardware components, which may have a predicate step of setting up data transfers between them.

Hardened processors in an SoC may include application-specific integrated circuits (ASIC), mixed signal implementations, or other non-FGPA implementations. Hardened processors can run an operating system (OS), which provides virtual memory and pages. Pages can cause data to be in physically non-contiguous regions, which make DMA transfers difficult. Ensuring data to be in physically contiguous memory regions with an OS can be a difficult task for hardware engineers.

Examples of the present disclosure may address one or more of these issues identified by inventors of examples of the present disclosure.

BRIEF DESCRIPTION OF THE DRAWINGS

FIG. 9 is an illustration of an example method for generating an SoC, according to examples of the present disclosure.

DETAILED DESCRIPTION

Figure 1:
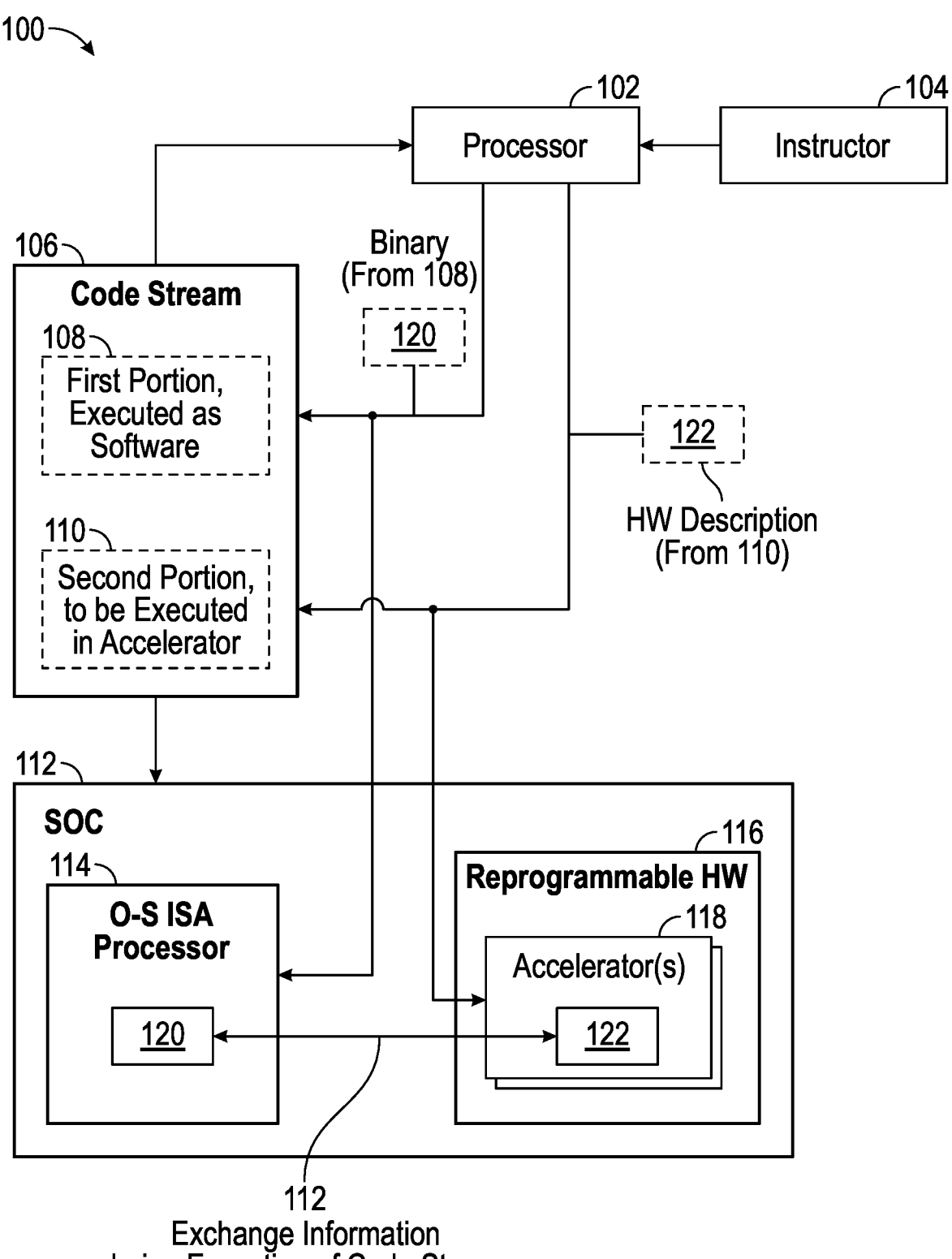
FIG. 1 is an illustration of a system for HLS for SoC generation for FPGAs, according to examples of the present disclosure.

FIG. 1 is an illustration of a system 100 for HLS for SoC generation for FPGAs, according to examples of the present disclosure.

System 100 may include an article of manufacture. The article of manufacture may include a non-transitory machine-readable medium. The medium may be implemented by, for example, any suitable memory. The medium may include instructions 104. Instructions 104, when read and executed by a processor 102, may cause the processor to generate a SoC at least partially in an FPGA. Instructions 104 as read and executed by processor 102 may in effect implement a compiler of an SoC, such as SoC 112.

Based upon instructions 104, processor 102 may identify a code stream 106. Code stream 106 may include any suitable contents, such as instructions, hardware descriptors, object code, programming language constructs, settings, or other suitable contents. Code stream 106 may be configured to be compiled, assembled, interpreted, or otherwise processed so as to be executed by SoC 112. Part of execution of code stream 106 by SoC 112 may include forming or defining parts of SoC 112 in reconfigurable hardware 116. Reconfigurable hardware 116 may be implemented by, for example FPGA fabric.

SoC 112 may include reconfigurable hardware 116. Moreover, SoC 112 may include a processor 114. Processor 114 may be an open standard instruction set architecture (ISA) processor. Specifically, processor 114 may be an RISC-V processor. Moreover, SoC 112 may include any suitable number and kind of accelerators 118. Accelerators 118 may include circuits designed to perform specific or specialized tasks, such as graphics processing, cryptography, mathematical computations, bitcoin mining, or any other tasks that may be offloaded from a processor. Accelerators 118 may be implemented within reprogrammable hardware 116. Moreover, in some examples, processor 114 may be implemented within reprogrammable hardware 116, while in other examples processor 114 may be implemented outside of reprogrammable hardware 116.

Instructions 104 may cause processor 102 to, from code stream 106, identify a first portion 108 of code stream 106 to be executed as software by processor 114. Instructions 104 may cause processor 102 to, from code stream 106, identify a second portion 110 of code stream 106 to be executed in accelerators 118. The execution may be performed by direct execution by processor 114 or by arrangement of programmed circuitry in programmable hardware 116.

Instructions 104 may cause processor 102 to compile first portion 108 of code stream 106 into a binary 120 for execution by processor 114. Instructions 104 may cause processor 102 to generate a hardware description 122 for second portion 110 of code stream 106. Based upon code stream 106, hardware description 122 and binary 120 may be configured to exchange data during execution of code stream 106 in SoC 112.

Processor 102 may load binary 120 and hardware description into SoC 112. Other portions of code stream 106 may also be loaded into SoC 112. Such other portions may be compiled or generated into hardware descriptions, as well as any other suitable portion of SoC 112 such as memories, peripherals, or interconnects. These may be loaded onto SoC 112 or configured in SoC 112.

Code stream 106 may include a C or C++ program. Code stream 106 may be partitioned into software and hardware partitions. First portion 108 may come from such software partitions and second portion 110 may come from such hardware partitions. Hardware partitions of code stream 106 may be compiled into hardware descriptions such as hardware description 122 that are written in, for example, HDL. The software partition may be compiled into binaries for execution on a RISC-V processor.

Figure 2:
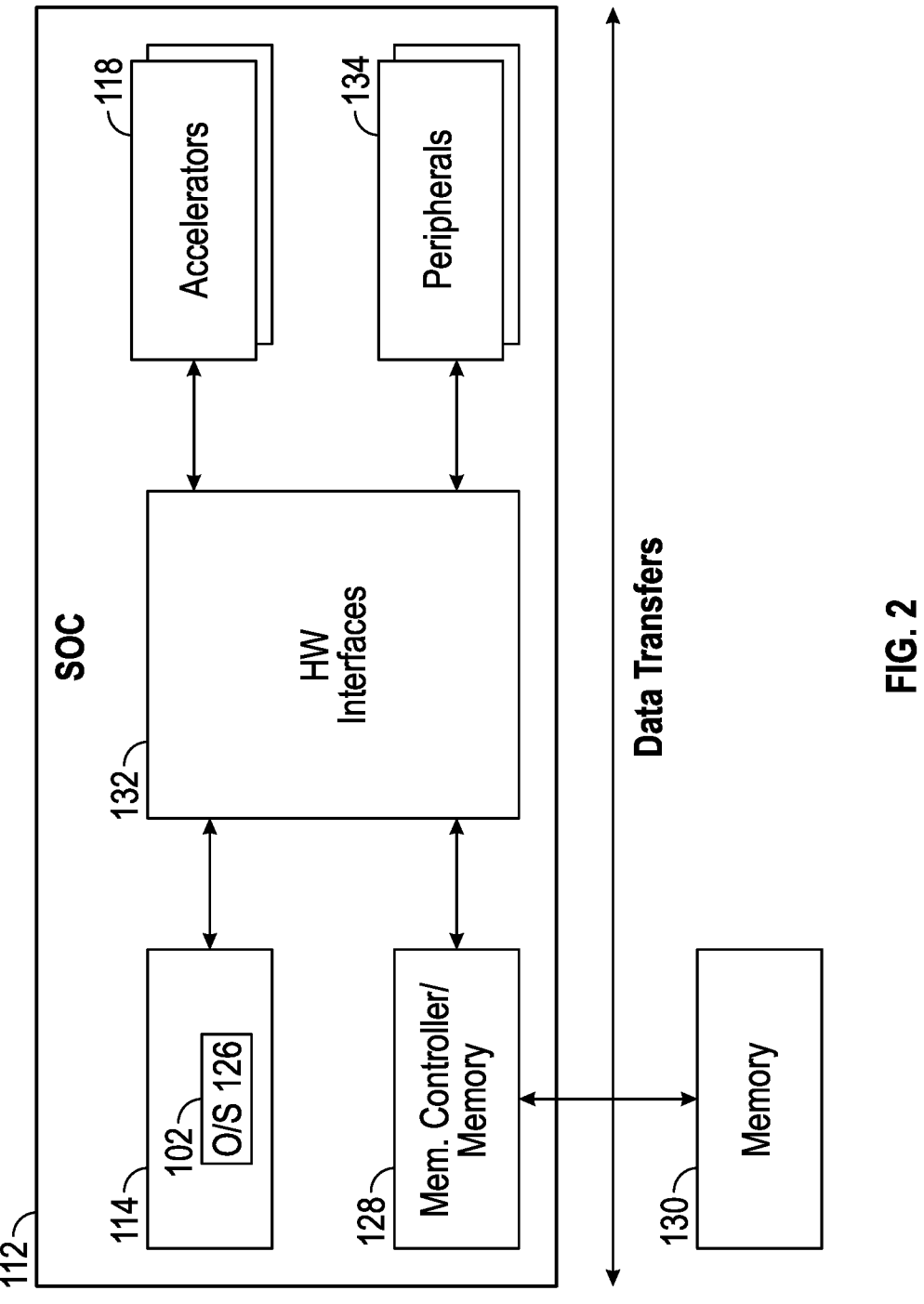
FIG. 2 is a more detailed illustration of a SoC, according to examples of the present disclosure.

FIG. 2 is a more detailed illustration of SoC 112, according to examples of the present disclosure.

SoC 112 may include peripherals 134. Peripherals 134 may be formed within reprogrammable hardware 116. Peripherals 134 may include any suitable circuits for facilitating operation of SoC 112 such as counters, pulsed-width modulation circuits, communication circuits for a given protocol such as serial or I2C bus interfaces, or timers.

Processor 114 may include an operating system 126. Operating system 126 may be configured to execute binary 120.

SoC 112 may include a memory controller circuit 128. Moreover, SoC 112 may include a memory integrated with memory controller circuit 128 or externally accessible as memory 130. Memory controller circuit 128 and memory may be formed within reprogrammable hardware 116. Memory controller circuit 128 may include a direct memory access (DMA) engine. Such memory may be a DDR memory.

Data access between the elements of SoC 112 may be made across any suitable number and kind of hardware interfaces 132. Hardware interfaces 132 may be formed within reprogrammable hardware 116. Hardware interfaces 132 may be implemented by, for example, switch fabric within reprogrammable hardware 116.

Data transfers between memory, such as within memory controller circuit/memory 128 or memory 130, and accelerators 118 can be handled automatically, wherein processor 102 generates driver functions from code stream 106 to transfer data to or from accelerators 118 and control accelerators 118.

Elements that may be formed within reprogrammable hardware 116 may be defined in code stream 106 and implemented by a hardware description, such as hardware description 122, as applied to reprogrammable hardware 116.

Figure 3A:
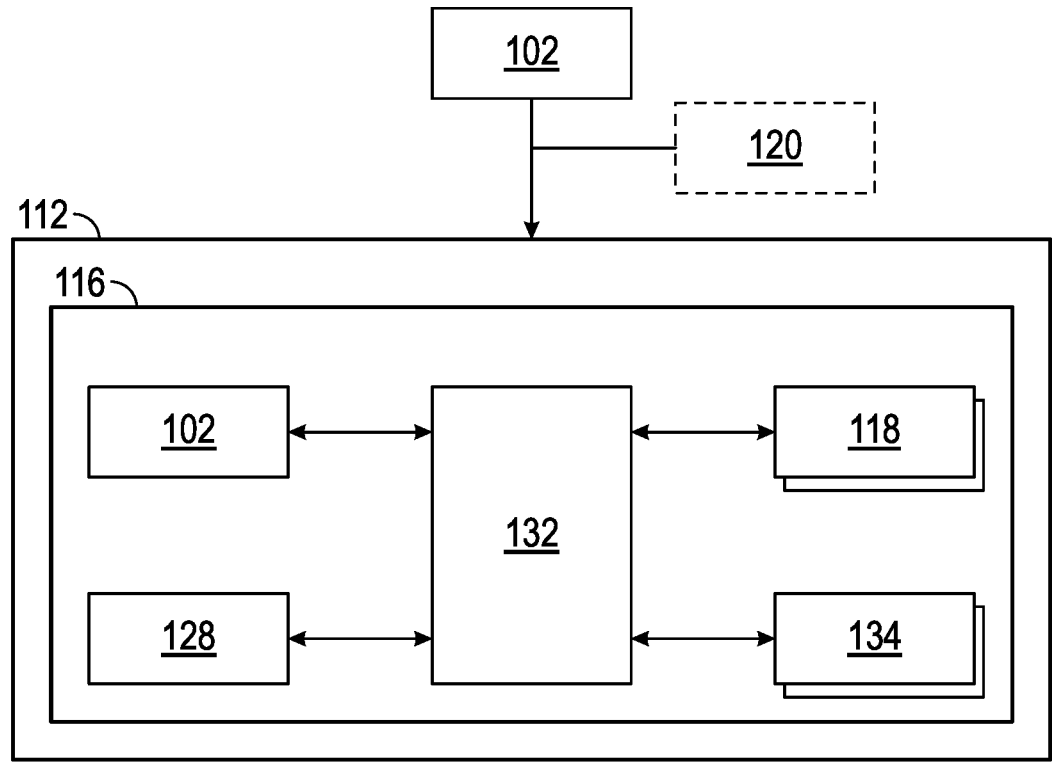
FIGS. 3A and 3B are illustrations of possible implementations of an SoC processor, according to examples of the present disclosure.
Figure 3B:
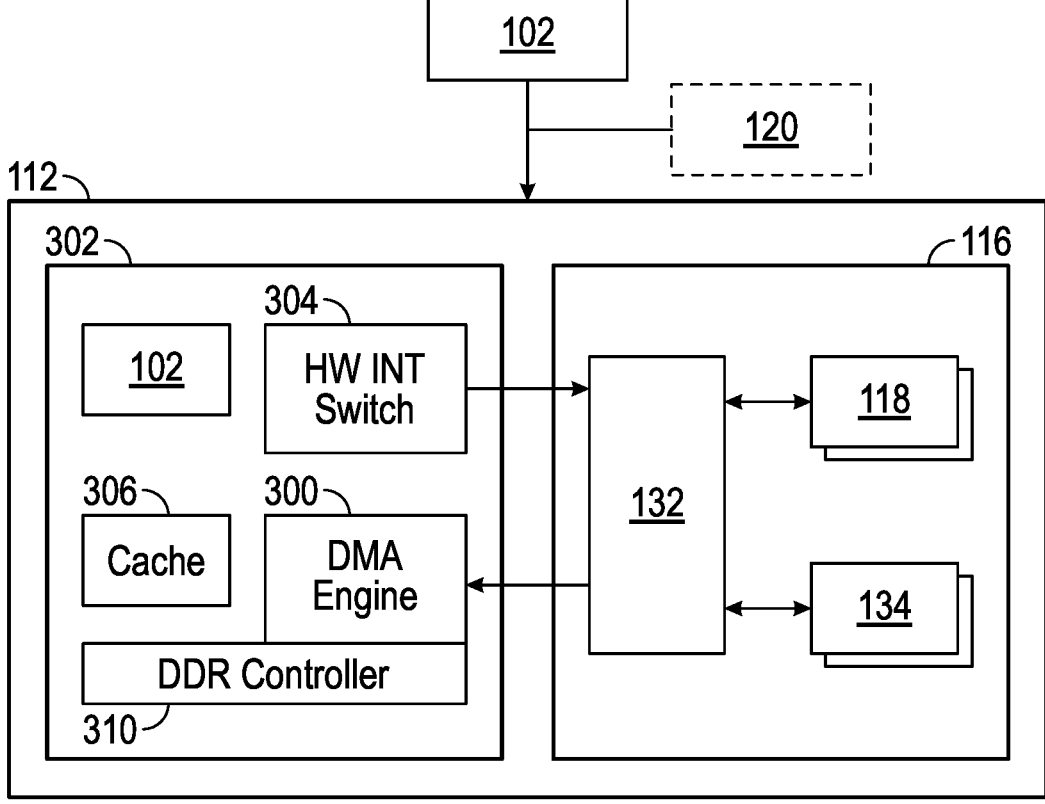

FIGS. 3A and 3B are illustrations of possible implementations of processor 114, according to examples of the present disclosure.

FIG. 3A illustrates an implementation of processor 114 as a soft processor, wherein code stream 106 defines the architecture of processor 114 and processor 114 is implemented within reprogrammable hardware 116.

FIG. 3B illustrates an implementation of processor 114 as a hardened processor, wherein processor 114 is implemented as a physical processor or ASIC outside of reprogrammable hardware 116. Processor 114 may utilize a processor socket 302. Processor socket 302 may also include components for interfacing processor 114 with the remainder of SoC 112, such as a hardware interface switch 304 for interfacing with hardware interfaces 132 to send data to, for example, accelerators 118. Processor socket 302 may include a DMA engine 308 for receiving memory outputs from, for example, accelerators 118. Processor socket 302 may include a cache 306 and a DDR controller circuit 310.

Processor 102, based upon instructions 104, may be configured to selectively generate binary 120 for processor 114 as implemented as a hardened processor in SoC 112 as shown in FIG. 3B or for processor 114 as implemented as a soft processor in reprogrammable hardware 116 of the SoC as shown in FIG. 3A. Generating binary 120 for processor 114 as implemented as a soft processor in reprogrammable hardware 116 may be accompanied by generating hardware description 122 for processor 114.

Figure 4:
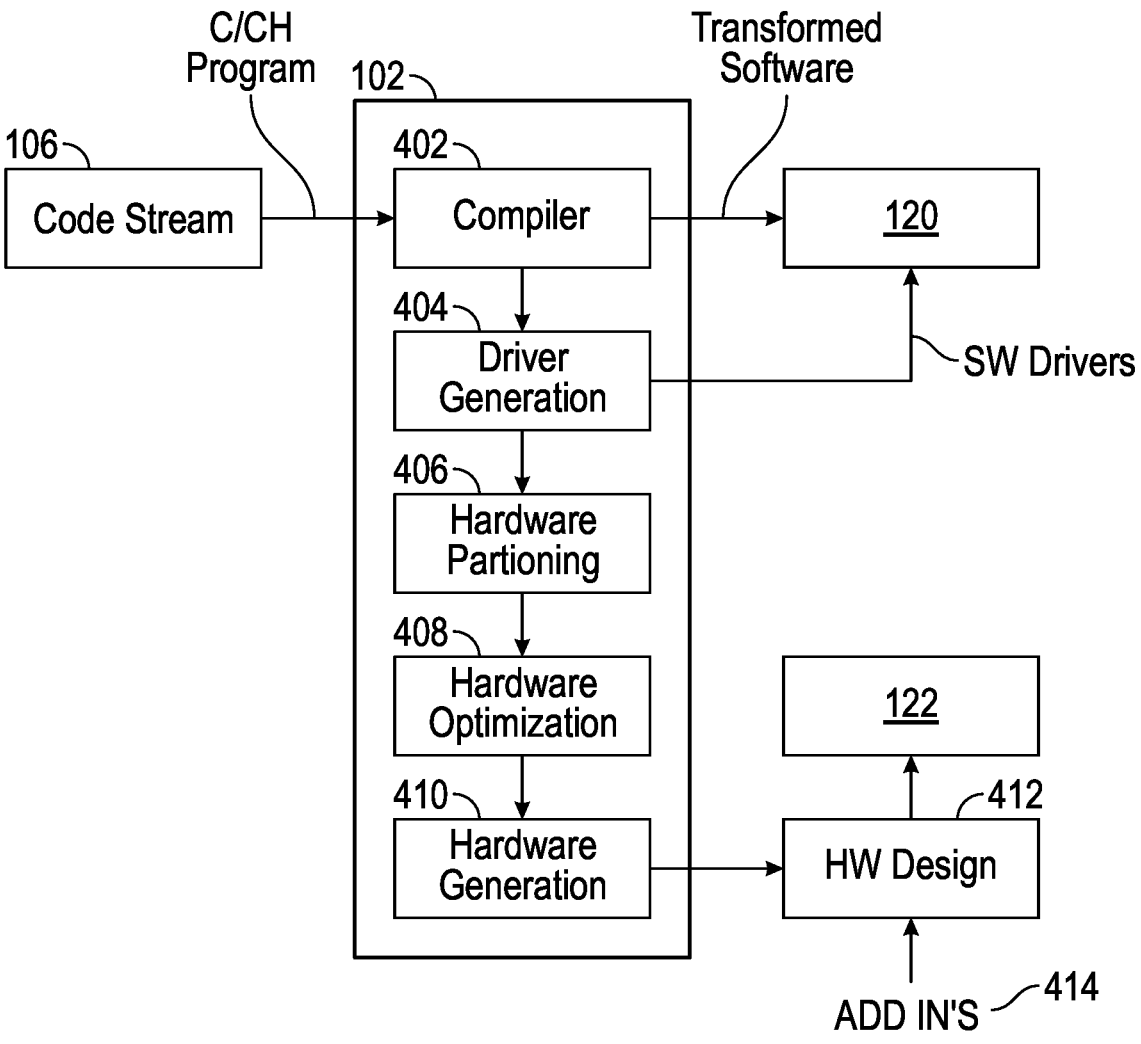
FIG. 4 is a more detailed illustration of generating a hardware description and binary, according to examples of the present disclosure.

FIG. 4 is a more detailed illustration of generating hardware description 122 and binary 120 by processor 102, according to examples of the present disclosure.

Code stream 106, as discussed above, may include a C or C++ program or set of instructions. Code stream 106 may include specification of one or more functions that are to be accelerated by accelerators 118.

Processor 102 may include or execute a compiler 402, driver generation 404, hardware partitioning 406, hardware optimization 408, and hardware generation 410. Each of compiler 402, driver generation 404, hardware partitioning 406, hardware optimization 408, and hardware generation 410 may be implemented by instructions 104 for execution by processor 102.

Compiler 402 may cause object code or other suitable executable code to be generated as transformed software and implemented in binary 120. Compiler 402 may be implemented by, for example, Clang or any suitable frontend compiler to transform an input program in code stream 106 to call software driver functions to invoke accelerators 118 rather than perform such functions in software executed by processor 114. Moreover, driver generation 404 may cause any suitable software drivers to be added to or linked with binary 120. These software drivers may include drivers to invoke accelerators 118 instead of executing such functions in processor 114. Moreover, in various examples, these software drivers may handle data transfers to and from memory and accelerators 118, and retrieve computed results. The transformed software from compiler 402 and the software drivers generated by driver generation 404 may form binary 120 or the software partition to be executed by processor 114. The software partition may be compiled with an RISC-V compiler toolchain to be executed RISC-V compiler.

Hardware partitioning 406, hardware optimization 408, and hardware generation 410 may cause a hardware design 412 to be generated. Any suitable add-in's, such as from libraries for generation of common components, may be added to hardware design 412 to yield hardware description 122. Hardware generation 410 may cause generation of descriptions of accelerators 118 in HDL. Scripts for integrating hardware, such as those written in Tcl, may be generated. The scripts may have commands for integrating hardware such as accelerators 118 with any additional circuits or components to form a complete SoC 112.

Figure 5:
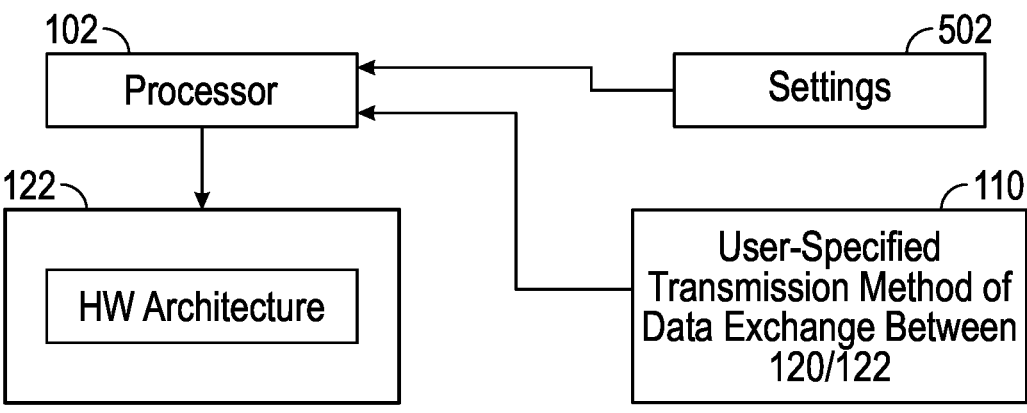
FIG. 5 is a more detailed illustration of generating a hardware description, according to examples of the present disclosure.

FIG. 5 is a more detailed illustration of generating hardware description 122, according to examples of the present disclosure.

Processor 102 may be configured to be able to generate different hardware data transfer architectures in SoC 112 by way of hardware description 122. Processor 102 may be so configured by different settings 502 set by users, or by different instructions in second portion 110. These may contain a user-specified transmission method for data exchange between binary 120 and hardware description 122. These different architectures are discussed in more detail in FIGS. 7-9, below.

Figure 6:
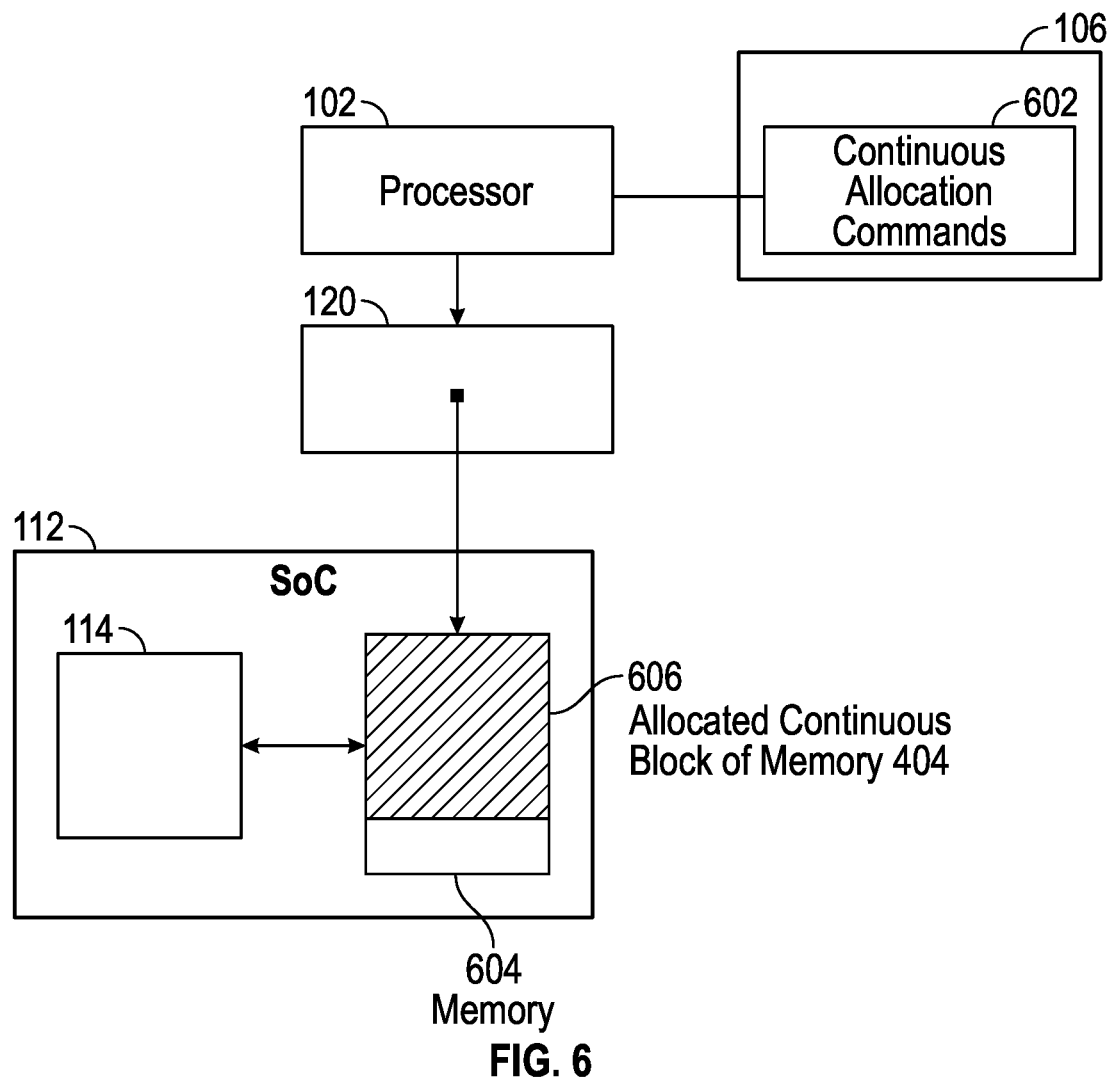
FIG. 6 is a more detailed illustration of generating a binary that defines allocations of contiguous memory, according to examples of the present disclosure.

FIG. 6 is a more detailed illustration of generating a binary 120 that defines allocations of contiguous memory, according to examples of the present disclosure.

Processor 102 may be configured to generate binary 120 to allocate a contiguous block 606 of memory 6-4 for use by processor 114, based upon a contiguous allocation command 602 in code stream 106.

Figure 7:
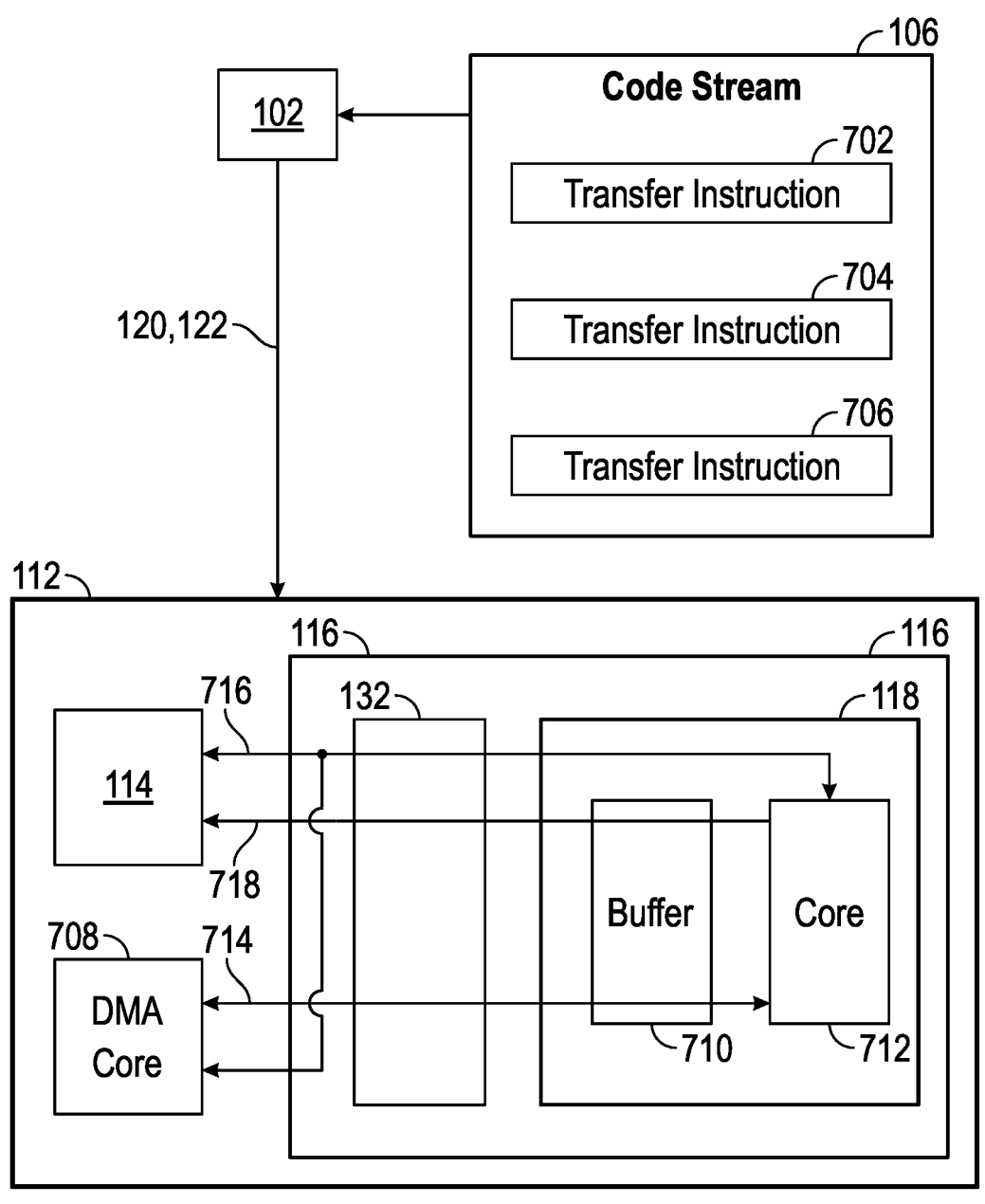
FIG. 7 is an illustration of defining possible data transfers in an SoC according to instructions in a code stream, according to examples of the present disclosure.

FIG. 7 is an illustration of defining possible data transfers in SoC 112 according to instructions in code stream 106, according to examples of the present disclosure.

Code stream 106 may include any suitable number and kind of transfer instructions, including a first transfer instruction 702, a second transfer instruction 704, and a third transfer instruction 706.

Accelerator 118 may include a core 712, which may include circuitry to perform the specialized acceleration computation for which execution is offloaded from processor 114 to accelerator 118. Accelerator 118 may include a buffer 710, which may optionally store results from core 712, depending on a defined architecture for hardware description 122, which may in turn depend upon which transfer instruction among transfer instructions 702-706 is used to define data transfer for the given instance of accelerator 118.

Figure 8:
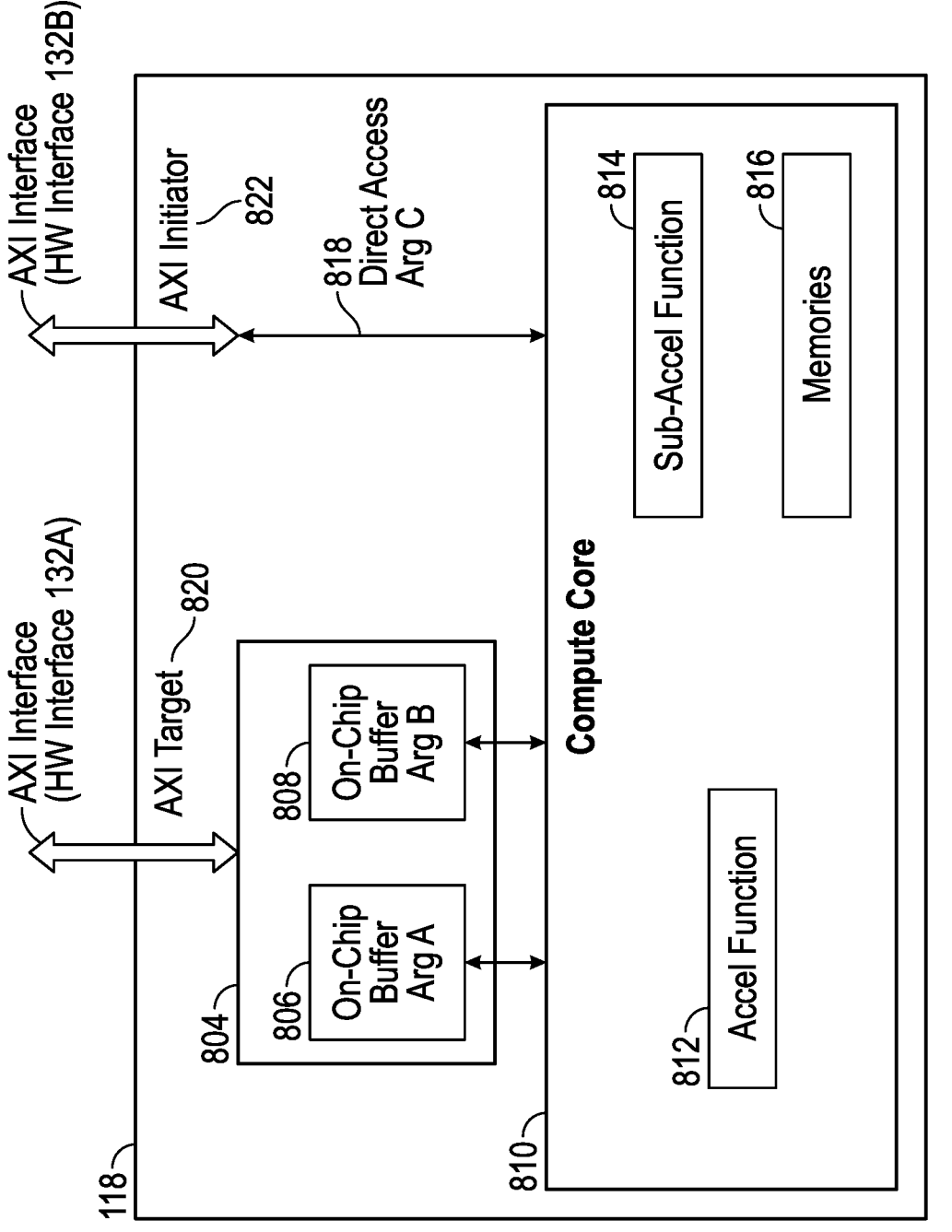
FIG. 8 is a more detailed illustration of an accelerator with various data transfer implementations, according to examples of the present disclosure.

In the examples of FIGS. 7-9, processor 114 can be implemented within reprogrammable hardware 116 or outside of reprogrammable hardware.

SoC 112 may include a DMA core 708. DMA core 708 may be implemented within reprogrammable hardware 116 or outside of reprogrammable hardware. DMA core 708 may be configured to manage access to actual memory (not shown) which may be implemented reprogrammable hardware 116 or outside of reprogrammable hardware. DMA core 708 may be an implementation of memory controller circuit 128. DMA core 708 may implement DMA engine circuit 300.

A user may define the preferred data transfer architecture or method for a given instance of accelerator 118 through selection of a specific one of transfer instructions 702-706 to be executed. Selection of a specific one of transfer instructions 702-706 may cause associated software drivers to be included in binary 120 and associated hardware architecture to be implemented in hardware description 122.

Processor 102 may be configured to, based upon first transfer instruction 702 in code stream 106, generate hardware description 122 and compile binary 120 to cause processor 114 and hardware accelerator 118 to exchange data during execution of code stream 106 through buffer 710 with DMA core circuit 708.

Processor 102 may be configured to, based upon second transfer instruction 702 in code stream 106, generate hardware description 122 and compile binary 120 to cause processor 114 and hardware accelerator 118 to exchange data during execution of code stream 106 through buffer 710 in the reprogrammable hardware without DMA use. Thus, DMA use of DMA core circuit 708 may be selectively enabled or disabled for use in data transfer.

Processor 102 may be configured to, based upon first transfer instruction 702 in code stream 106, generate hardware description 122 and compile binary 120 to cause processor 114 and hardware accelerator 118 to exchange data during execution of code stream 106 through a bypass of buffer 710 in reprogrammable hardware 116. Thus, buffer 710 may be selectively enabled or disabled for use in data transfer.

FIG. 8 is a more detailed illustration of accelerator 118 with various data transfer implementations, according to examples of the present disclosure.

Accelerator 118 may include any suitable number and kind of connections to the rest of SoC 112. In the example of FIG. 8, two possible connections are shown. These connections may be implemented through hardware interfaces 132. The connections may be implemented according to the Advanced eXtensible Interface (AXI) standard. A connection may be provided directly to compute core 810 (which may be an implementation of core 712) through hardware interface 132B. Such a connection may be referred to as AXI initiator 822 (also known as an AXI manage). AXI initiator 822 may be an interface used by compute core 810 to directly access data outside of accelerator 118. AXI initiator 822 can write to external memory and read data back. A connection may be provided indirectly to compute core 810, routed through a buffer 804 (which may be an implementation of buffer 710). Such a connection may be referred to as AXI target 820 (also known as an AXI subordinate). AXI target 820 may be an interface used by processor 114 to write data to the on-chip buffers 806, 808 and read data back. Processor 114 may initiate these transactions.

Buffer 804 may include any suitable number and kind of on-chip buffers. For example, buffer 804 may include on-chip buffer 806 and on-chip buffer 808. On-chip buffer 806 and on-chip buffer 808 may be respectively referenced in code stream 106 as "argA" and "argB" when the respective on-chip buffer is to be used for a given execution or data exchange.

Compute core 810 may be configured to provide its results through buffer 804, and through a respective one of the on-chip buffers therein through designation in a command of code stream 106 that uses argA or argB. From there, DMA core engine circuit 708 may be configured to collect the results through hardware interface 132A and transfer the results to other memories or otherwise make the results available to processor 114. Compute core 810 may be configured to provide its results directly through hardware interface 132B to any other part of SoC 112, such as processor 114.

Compute core 810 may include any suitable number and kind of functions that are to execute tasks as specified in code stream 106, which may be invoked through software drivers in binary 120. For example, compute core 810 may include an accel function 812 and a sub_accel function 814. Compute core 810 may include any suitable number and kind of on-board memories 816.

Users may select which mechanism is used for data transfer by changing a parameter, such using argA, arbB, or argC in code stream 106.

By default, the driver functions may invoke a data exchange to transfer data with the C "memcpy function", which performs copying by processor 114. This may include use of argC. For larger data transfers, DMA core circuit 708 can transfer data in bursts using a DMA copy method for higher bandwidth transfer. This type of data transfer may use AXI Target interface 820 to write/read data to/from on-chip buffers 804, 806. For low latency memory accesses, accelerator 118 can also access DDR memory directly using an accelerator direct access method. Compute core 810 uses AXI initiator 822 to do this.

An example segment of pseudo-code that may represent instructions in code stream 106 that can be offloaded for execution at least in part by accelerator 118 may be:

```
uint64_t accel_function(uint8_t argA[16], uint16_t argB[8], uint32_t
argC[4]) {
    #pragma HLS function top
    #pragma HLS interface default type(axi_target)
    #pragma HLS interface argument(argC) type(axi_initiator)
    sub_accel_function(...);
}
void sub_accel_function(...) { ...}
```

The "HLS" terms in the code may denote that the process of generating hardware description 122 and binary code 120 is to be followed so as to create accelerator 118 in SoC 112 to execute "accel_function" (812) when so invoked in code stream 106. "HLS" may stand for "high level synthesis" to denote this process. The use of pragmas may be used to specify which functions are to be accelerated to hardware in accelerators 118. Thus, code stream 106 may specify the top-level function of a given instance of hardware accelerator 118 with the pragma, "#pragma HLS function top". Processor 102 may be configured to take this function ("accel_function") and its descendent functions (such as "sub_accel_function") to be compiled into an instance of accelerator 118 and specified by hardware description 122. Any suitable number and kind of functions may be specified with the "function top" pragma, each of which may become an instance of accelerator 118.

The interface for a given instance of accelerator 118 may be automatically generated based on contents of code stream 106, such as user-provided pragma and accelerator function arguments. For example, the pragma "#pragma HLS interface default type(axi_target)" indicates that an AXI target interface may be generated for accelerator 118. When an AXI target interface is used, an AXI target adapter may be instantiated, which may contain memories for where the accelerator's function arguments from DDR memory can be transferred. Processor 102 may analyze the arguments to generate the type of memory to use. For scalar function arguments (i.e., integers), the arguments may be stored in registers. For pointers, arrays, and structures, arguments may be stored in on-chip buffers such as buffers 806, 808. Compute core 810 may read arguments from buffers 806, 808 s to perform computations as well as write computed results back to buffers 806, 808. Compute core 810 may also have local memories 816 for data not shared with other components of SoC 112. When accelerator 118 finishes running, the computed results may be retrieved from on-chip buffers 806, 808 back to memory by processor 114 or DMA engine circuit 708, depending on type of transfer method being used. By default, processor 114 may be configured to transfer the data to and from on-chip buffers 806, 808.

However, with a pragma such as "dma(true)", a user can specify in code steam 106 that DMA engine 708 is to perform the data transfer. The "dma(true) option might only be valid for when the interface for the argument is specified as AXI Target, as the DMA transfer data is to on-chip data buffers. For example, "#pragma HLS interface argument (argA) type(axi_target) dma(true)" may be used.

FIG. 8 shows implementations of three different interface pragmas to illustrate transfer methods of CPU copy, DMA copy, and accelerator direct access. These may include methods specified variously by:

```
#pragma HLS interface argument(argA) type(axi_target) dma(true)
#pragma HLS interface argument(argB) type(axi_target)
#pragma HLS interface argument(argC) type(axi_initiator)
```

With the "dma(true)" pragma option for argument "argA", code stream 106 may specify that the argument is to be transferred to and from buffer 806 with a DMA engine such as DMA engine circuit 300 or DMA core 708. Processor 102 may set up operation of DMA engine circuit 300 or DMA core 708 and generate driver code for DMA engine circuit 300 or DMA core 708 to perform the data transfer. This may be included in binary 120.

With the lack of a "dma(true)" pragma option for argument "arbB", a CPU copy method may be used to transfer data to and from buffer 808 without a DMA engine, and instead performed by processor 114.

For "argC", the "axi_initiator" option may cause an accelerator direct access method to be used by creating an AXI Initiator (i.e., AXI Manager) interface in accelerator 118, wherein compute core 810 directly accesses the cache of processor 114 and SoC memory such as a DDR memory. This method may be used, for example, when data needs to be streamed directly into compute core 810 without being buffered. This may also reduce on-chip memory usage, as on-chip buffers 806, 808 might not be required.

Below is example code for a software partition that may be run on processor 114 as part of binary 120, including the generated driver functions for functions for accelerator 118. This example code may be run on a Linux operating system, which may use the "hls_alloc" library for arguments using DMA copy or accelerator direct access methods. In the Linux operating system, when data needs to be transferred via DMA, or when accelerator 118 directly accesses DDR memory, it may be a requirement that accessed data resides in a physically contiguous memory region. Accordingly, the "hls_malloc" function may be called to allocate contiguous memory regions for the arguments. The "hls_malloc" function may have the same function signature as the standard C "malloc" function used to allocate memory in C. Allocated memories may be freed with, for example, the function "hls_free", which has the same function signature as the standard C "free" function. The "hls_alloc" and "hls_free" functions might be used for DMA transfers and accelerator direct accesses, but might be unnecessary for when processor 114 copies the data with "memcpy" (i.e., a CPU copy method).

Given the "accel_function" designated for hardware acceleration, processor 102 may transform the body of accel_function to call the generated "accel_function_hls_driver" function. For conciseness, the high-level structure of the driver functions is described but not all definitions of the sub-function are shown. The top-level driver function, "accel_function_hls_driver", may call two sub-functions, "accel_function_write_input_and_start" and "accel_func-tionjoin_and_read_output". The "accel_function_write_input_and_start" function may set up the accelerator func-tion, transfers the arguments, and starts the accelerator. For the "argA" argument, which was specified in the pragma as DMA Copy, the "accel_function dma write argA" function transfers 16 bytes from the argA pointer via DMA. For the "argB" argument, which defaults to the CPU Copy method, processor 114 may transfer the 16 bytes of data from the argB pointer with the memcpy function call. For the "argC" argument, which will be directly accessed by accelerator 118, only the pointer address needs to be given to Soc design. SmartHLS analyzes the hardware functions to determine what types of interfaces are required and how much address space is needed based on the accelerator function's arguments—the bigger the sizes of arguments, the bigger the address space. It assigns appropriate memory mapped addresses for each accelerator and invokes Smart-Design with the generated Tcl script to integrate the accel-erators to an SoC design with the RISC-V processor system, memories, interconnect, and peripherals. This integration process is completely automated and requires no user inter-vention.

```
#include "hls/hls alloc.h"
int main( ) {
    // Allocate contiguous memory regions
    uint8_t *argA = (uint8_t*) hls_malloc(16);
    uint16_t *argB = ...;
    uint32_t *argC = (uint32_t*) hls_malloc(16);
    ...
    // Call accelerator function
    uint64_t result = accel_function(...);
    ...
    // Free allocated memory regions
    hls_free((void*)argA);
    hls_free((void*)argC);
}
uint64_t accel_function(uint8_t argA[16], uint16_t argB[8], uint32_t argC[4]) {
    // Call accelerator driver function
// Compiler has rewritten the guts of this
    uint64 t_result accel_function_hls_driver(argA, argB, argC);
}
// Calls accelerator and retrieves return value when done
uint64_t accel_function_hls_driver(void* argA, void* argB, void* argC) {
    accel_function_write_input_and_start(argA, argB, argC);
    return accel_function_join_and_read_output( );
}
// Transfer arguments and start the accelerator
void accel_function_write_input_and_start(void* argA, void* argB, void* argC) {
    // Run setup function
    if (accel_function_setup( ) == 1) {
        printf("Error: setup function failed for accel_function");
        exit(EXIT_FAILURE);
    }
    // Transfer arguments
    accel_function_dma_write_argA(argA, 16);
    accel_function_memcpy_write_argB(argB, 16);
    accel_function_write_argC_ptr_addr(argC);
    // Start accelerator
    accel_function_start( );
}
// Wait for accelerator to finish and retrieve return value
uint64_t accel_function_join_and_read_output( ) {
    uint64_t acc_ret_val = accel_function_join( );
    return acc_ret_val;
}
``` accelerator 118 with the "accel_function_write_argCptr_addr" function. After all argument data are trans-ferred, accelerator 118 may be called.

The "accel_functionjoin_and_read_output" function may call the "accel_functionjoin" sub-function, which may check if accelerator 118 has finished execution. If finished, the sub-function may retrieve the return value from accelerator 118. This example might not have any output arrays which are written to by accelerator 118. If any output arrays exist, they can be copied back by processor 114 or DMA engine circuit 300 or DMA core 708, or can be written to memory directly by accelerator 118. Finally, the return value may be returned to the top-level driver function, which subsequently returns it to the accelerator function.

SmartHLS also generates Tcl scripts to automate the process of integrating hardware accelerators into its target FIG. 9 is an illustration of an example method 900 for generating an SoC, according to examples of the present disclosure. Method 900 may be performed by any suitable elements, such as those of system 100 as shown in FIGS. 1-8. For example, method 900 may be performed by pro-cessor 102. Method 900 may be executed with more or fewer steps than shown in FIG. 9, and the steps of method 900 may be optionally omitted, repeated, performed in a different order, performed in parallel, or recursively.

At 905, a code stream to be executed by an SoC may be identified. The SoC may include an open standard ISA processor and a hardware accelerator implemented in repro-grammable hardware.

At 910, a first portion of the code stream to be executed as software by the open standard ISA processor of the SoC and a second portion of the code stream to be executed in the hardware accelerators of the SoC may be identified.

At 915, the first portion of the code stream may be compiled into a binary for execution by the open standard ISA processor of the SoC. At 920, it may be determined whether the processor is a hardened processor or a softened processor. If the processor is a hardened processor, then at 920 a binary may be generated for the hardened processor. If the processor is a softened processor, then at 925 a binary may be generated for the softened processor. Moreover, in later steps, such as 940, a hardware description for the processor may be generated.

At 935, the binary may be generated to allocate a contiguous block of memory for use by the open standard ISA processor, based upon a contiguous allocation command in the code stream.

At 940, a hardware description for the second portion of the code stream to be implemented by the hardware accelerators may be generated, wherein the hardware description and the binary are to exchange data during execution of the code stream. The hardware architecture of the hardware description may be generated based upon a user-specified transmission method of exchanging data between the hardware description and the binary.

At 945, based upon a first transfer instruction in the code stream, the hardware description may be generated, and the binary compiled to cause the open standard ISA processor and a first hardware accelerator to exchange data during execution of the code stream through a buffer in the reprogrammable hardware with a direct memory access core.

At 950, based upon a second transfer instruction in the code stream, the hardware description may be generated, and the binary compiled to cause the open standard ISA processor and a first hardware accelerator to exchange data during execution of the code stream through a buffer in the reprogrammable hardware without director memory access.

At 955, based upon a third transfer instruction in the code stream, the hardware description may be generated, and the binary compiled to cause the open standard ISA processor and a first hardware accelerator to exchange data during execution of the code stream directly through a bypass of a buffer in the reprogrammable hardware.

Examples of the present disclosure may include an article of manufacture. The article may include a non-transitory machine-readable medium. The medium may include instructions. The instructions, when read and executed by a processor, may cause the processor to identify a code stream to be executed by a SoC. The SoC may include an open ISA processor and one or more hardware accelerators implemented in reprogrammable hardware. The instructions may cause the processor to, from the code stream, identify a first portion of the code stream to be executed as software by the open standard ISA processor of the SoC and a second portion of the code stream to be executed in the one or more hardware accelerators of the SoC. The instructions may cause the processor to compile the first portion of the code stream into a binary for execution by the open standard ISA processor of the SoC. The instructions may cause the processor to generate a hardware description for the second portion of the code stream to be implemented by the hardware accelerators. The hardware description and the binary are to exchange data during execution of the code stream.

In combination with any of the above examples, the processor may be to selectively generate the binary for the open standard ISA processor as implemented as a hardened processor in the SoC or the open standard ISA processor as implemented as a soft processor in the reprogrammable hardware of the SoC.

In combination with any of the above examples, the processor may be to selectively generate a hardware architecture of the hardware description based upon a user-specified transmission method of exchanging data between the hardware description and the binary.

In combination with any of the above examples, the processor may be to generate the binary to allocate a contiguous block of memory for use by the open standard ISA processor, based upon a contiguous allocation command in the code stream.

In combination with any of the above examples, the processor may be to, based upon a first transfer instruction in the code stream, generate the hardware description and compile the binary to cause the open standard ISA processor and a first hardware accelerator of the one or more hardware accelerators to exchange data during execution of the code stream through a buffer in the reprogrammable hardware with a direct memory access core.

In combination with any of the above examples, the processor may be to, based upon a second transfer instruction in the code stream, generate the hardware description and compile the binary to cause the open standard ISA processor and a first hardware accelerator to exchange data during execution of the code stream through a buffer in the reprogrammable hardware without direct memory access.

In combination with any of the above examples, the processor may be to, based upon a third transfer instruction in the code stream, generate the hardware description and compile the binary to cause the open standard ISA processor and a first hardware accelerator to exchange data during execution of the code stream directly through a bypass of a buffer in the reprogrammable hardware.

Examples of the present disclosure may include an SoC generated by any of the above examples, including execution of the instructions in any of the above articles of manufacture.

Examples of the present disclosure may include an SoC with an open standard ISA processor and one or more hardware accelerators implemented in reprogrammable hardware. The open standard ISA processor may be to execute a binary generated from a first portion of a code stream. A second portion of the code stream may be implemented by a hardware description in the hardware accelerators. The hardware description and the binary may be used to exchange data during execution of the code stream.

In combination with any of the above examples, the open standard ISA processor may be implemented as a soft processor in the reprogrammable hardware of the SoC.

In combination with any of the above examples, the binary may be to allocate a contiguous block of memory for use by the open standard ISA processor based upon a contiguous allocation command in the code stream.

In combination with any of the above examples, the open standard ISA processor and one of the hardware accelerators may be to, based upon a first transfer instruction in the code stream, exchange data during execution of the code stream through a buffer in the reprogrammable hardware with a direct memory access core.

In combination with any of the above examples, the open standard ISA processor and one of the hardware accelerators may be to, based upon a second transfer instruction in the code stream, exchange data during execution of the code stream through a buffer in the reprogrammable hardware without director memory access.

In combination with any of the above examples, the open standard ISA processor and one of the hardware accelerators may be to, based upon a third transfer instruction in the code stream, exchange data during execution of the code stream directly through a bypass of a buffer in the reprogrammable hardware.

Examples of the present disclosure may include a method performed by any of the above examples, including execution of the instructions in any of the above articles of manufacture or performance of any of the above SoCs.

Examples of the present disclosure may include a method. The method may include identifying a code stream to be executed by an SoC. The SoC may include an open standard open standard ISA processor and one or more hardware accelerators implemented in reprogrammable hardware. The method may include, from the code stream, identifying a first portion of the code stream to be executed as software by the open standard ISA processor of the SoC and a second portion of the code stream to be executed in the hardware accelerators of the SoC. The method may include compiling the first portion of the code stream into a binary for execution by the open standard ISA processor of the SoC. The method may include loading the binary onto the SoC, generating a hardware description for the second portion of the code stream to be implemented by the hardware accelerators, and loading the hardware description onto the SoC. The hardware description and the binary may be used to exchange data during execution of the code stream.

In combination with any of the above examples, the method may include selectively generating the binary for the open standard ISA processor as implemented as a hardened processor in the SoC or open standard ISA processor as implemented as a soft processor in the reprogrammable hardware of the SoC.

In combination with any of the above examples, the method may include selectively generating a hardware architecture of the hardware description based upon a user-specified transmission method of exchanging data between the hardware description and the binary.

In combination with any of the above examples, the method may include comprising generating the binary to allocate a contiguous block of memory for use by the open standard ISA processor, based upon a contiguous allocation command in the code stream.

In combination with any of the above examples, the method may include, based upon a first transfer instruction in the code stream, generating the hardware description and compile the binary to cause the open standard ISA processor and a first hardware accelerator to exchange data during execution of the code stream through a buffer in the reprogrammable hardware with a direct memory access core.

In combination with any of the above examples, the method may include, based upon a second transfer instruction in the code stream, generating the hardware description and compile the binary to cause the open standard ISA processor and a first hardware accelerator to exchange data during execution of the code stream through a buffer in the reprogrammable hardware without director memory access.

In combination with any of the above examples, the method may include, based upon a third transfer instruction in the code stream, generating the hardware description and compile the binary to cause the open standard ISA processor and a first hardware accelerator to exchange data during execution of the code stream directly through a bypass of a buffer in the reprogrammable hardware.

Although examples have been described above, other variations and examples may be made from this disclosure without departing from the spirit and scope of these examples.

We claim:

1. An article of manufacture comprising a non-transitory machine-readable medium, the medium comprising instructions, the instructions, when read and executed by a processor, cause the processor to:

identify a code stream to be executed by a system-on-a-chip (SoC), the SoC to include an open standard instruction set architecture (ISA) processor and one or more hardware accelerators implemented in reprogrammable hardware;

from the code stream, identify a first portion of the code stream to be executed as software by the open standard ISA processor of the SoC and a second portion of the code stream to be executed in the one or more hardware accelerators of the SoC;

compile the first portion of the code stream into a binary for execution by the open standard ISA processor of the SoC;

generate a hardware description for the second portion of the code stream to be implemented by the one or more hardware accelerators; and wherein the hardware description and the binary are to exchange data during execution of the code stream.

2. The article of claim 1, wherein the processor is to selectively generate the binary for the open standard ISA processor as implemented as a hardened processor in the SoC or the open standard ISA processor as implemented as a soft processor in the reprogrammable hardware of the SoC.

3. The article of claim 1, wherein the processor is to selectively generate a hardware architecture of the hardware description based upon a user-specified transmission method of exchanging data between the hardware description and the binary.

4. The article of claim 1, wherein the processor is to generate the binary to allocate a contiguous block of memory for use by the open standard ISA processor, based upon a contiguous allocation command in the code stream.

5. The article of claim 1, wherein the processor is to, based upon a first transfer instruction in the code stream, generate the hardware description and compile the binary to cause the open standard ISA processor and a first hardware accelerator of the one or more hardware accelerators to exchange data during execution of the code stream through a buffer in the reprogrammable hardware with a direct memory access core.

6. The article of claim 1, wherein the processor is to, based upon a second transfer instruction in the code stream, generate the hardware description and compile the binary to cause the open standard ISA processor and a first hardware accelerator to exchange data during execution of the code stream through a buffer in the reprogrammable hardware without direct memory access.

7. The article of claim 1, wherein the processor is to, based upon a third transfer instruction in the code stream, generate the hardware description and compile the binary to cause the open standard ISA processor and a first hardware accelerator to exchange data during execution of the code stream directly through a bypass of a buffer in the reprogrammable hardware.

8. A method, comprising:

identifying a code stream to be executed by a system-on-a-chip (SoC), the SoC to include an open standard ISA processor and one or more hardware accelerators implemented in reprogrammable hardware;

from the code stream, identifying a first portion of the code stream to be executed as software by the open standard ISA processor of the SoC and a second portion of the code stream to be executed in the one or more hardware accelerators of the SoC;

compiling the first portion of the code stream into a binary for execution by the open standard ISA processor of the SoC;

loading the binary onto the SoC;

generating a hardware description for the second portion of the code stream to be implemented by the one or more hardware accelerators; and loading the hardware description onto the SoC;

wherein the hardware description and the binary are to exchange data during execution of the code stream.

9. The method of claim 8, comprising selectively generating the binary for the open standard ISA processor as implemented as a hardened processor in the SoC or open standard ISA processor as implemented as a soft processor in the reprogrammable hardware of the SoC.

10. The method of claim 8, comprising selectively generating a hardware architecture of the hardware description based upon a user-specified transmission method of exchanging data between the hardware description and the binary.

11. The method of claim 8, comprising generating the binary to allocate a contiguous block of memory for use by the open standard ISA processor, based upon a contiguous allocation command in the code stream.

12. The method of claim 8, comprising, based upon a first transfer instruction in the code stream, generating the hardware description and compile the binary to cause the open standard ISA processor and a first hardware accelerator to exchange data during execution of the code stream through a buffer in the reprogrammable hardware with a direct memory access core.

13. The method of claim 8, comprising, based upon a second transfer instruction in the code stream, generating the hardware description and compile the binary to cause the open standard ISA processor and a first hardware accelerator to exchange data during execution of the code stream through a buffer in the reprogrammable hardware without director memory access.

14. The method of claim 8, comprising, based upon a third transfer instruction in the code stream, generating the hardware description and compile the binary to cause the open standard ISA processor and a first hardware accelerator to exchange data during execution of the code stream directly through a bypass of a buffer in the reprogrammable hardware.

15. A system-on-a-chip (SoC), comprising:

an open standard ISA processor;

one or more hardware accelerators implemented in reprogrammable hardware;

wherein the open standard ISA processor is to execute a binary generated from a first portion of a code stream;

a second portion of the code stream is to be implemented by a hardware description in the one or more hardware accelerators;

wherein the hardware description and the binary are to exchange data during execution of the code stream.

16. The SoC of claim 15, wherein the open standard ISA processor is implemented as a soft processor in the reprogrammable hardware of the SoC.

17. The SoC of claim 15, wherein the binary is to allocate a contiguous block of memory for use by the open standard ISA processor based upon a contiguous allocation command in the code stream.

18. The SoC of claim 15, wherein the open standard ISA processor and one of the hardware accelerators are to, based upon a first transfer instruction in the code stream, exchange data during execution of the code stream through a buffer in the reprogrammable hardware with a direct memory access core.

19. The SoC of claim 15, wherein the open standard ISA processor and one of the hardware accelerators are to, based upon a second transfer instruction in the code stream, exchange data during execution of the code stream through a buffer in the reprogrammable hardware without director memory access.

20. The SoC of claim 15, wherein the open standard ISA processor and one of the hardware accelerators are to, based upon a third transfer instruction in the code stream, exchange data during execution of the code stream directly through a bypass of a buffer in the reprogrammable hardware.

* * * * *